(12) United States Patent
Novil et al.

(10) Patent No.: US 7,234,705 B2
(45) Date of Patent: Jun. 26, 2007

(54) SEALING GASKET WITH FLEXIBLE STOPPER

(75) Inventors: Martin Novil, Northville, MI (US); Yingjie Kong, Canton, MI (US); Scott M. Anderson, Canton, MI (US); Ronald W. Wangerow, Novi, MI (US)

(73) Assignee: Freudenberg-Nok General Partnership, Plymouth, MI (US)

( * ) Notice: Subject to any disclaimer, the term of this patent is extended or adjusted under 35 U.S.C. 154(b) by 0 days.

(21) Appl. No.: 10/699,901

(22) Filed: Nov. 3, 2003

(65) Prior Publication Data

US 2005/0046117 A1   Mar. 3, 2005

Related U.S. Application Data

(63) Continuation-in-part of application No. 10/650,334, filed on Aug. 28, 2003, now Pat. No. 6,828,176.

(51) Int. Cl.
F02F 11/00 (2006.01)
F16J 15/08 (2006.01)

(52) U.S. Cl. ................ 277/593; 277/592; 277/595

(58) Field of Classification Search ......... 277/592–596
See application file for complete search history.

(56) References Cited

U.S. PATENT DOCUMENTS

| | | | | |
|---|---|---|---|---|
| 3,053,544 A | * | 9/1962 | Gorsica ............... | 277/593 |
| 3,794,333 A | * | 2/1974 | Czernik et al. ........ | 277/593 |
| 4,140,323 A | * | 2/1979 | Jacobs ................ | 277/594 |
| 4,625,979 A | * | 12/1986 | Inciong ............... | 277/596 |
| 5,267,740 A | * | 12/1993 | Stritzke .............. | 277/596 |
| 5,341,779 A | * | 8/1994 | Chen et al. ........... | 123/193.3 |
| 5,690,342 A | * | 11/1997 | Tanaka et al. ......... | 277/594 |
| 5,791,659 A | * | 8/1998 | Takada et al. ......... | 277/593 |
| 5,988,651 A | | 11/1999 | Miyaoh | |
| 6,036,195 A | * | 3/2000 | Udagawa .............. | 277/595 |
| 6,056,296 A | | 5/2000 | Ii et al. | |
| 6,070,882 A | | 6/2000 | Abe et al. | |
| 6,089,572 A | | 7/2000 | Plunkett | |
| 6,131,915 A | * | 10/2000 | Nicholson ............. | 277/593 |
| 6,164,662 A | | 12/2000 | Uemura et al. | |
| 6,180,167 B1 | | 1/2001 | Majewski et al. | |

(Continued)

FOREIGN PATENT DOCUMENTS

| | | |
|---|---|---|
| EP | 0 757 195 B1 | 6/2000 |
| EP | 0 769 616 B1 | 11/2000 |
| EP | 0 816 723 B1 | 9/2002 |
| EP | 1 099 891 B1 | 11/2003 |
| EP | 0 915 271 B1 | 12/2003 |
| EP | 0 915 272 B1 | 12/2003 |
| EP | 1 271 016 B1 | 3/2004 |
| WO | WO 01/02714 A1 | 1/2001 |
| WO | WO 02/079630 A1 | 10/2002 |

Primary Examiner—Alison K. Pickard
(74) Attorney, Agent, or Firm—Harness, Dickey & Pierce, P.L.C.

(57) ABSTRACT

A sealing gasket assembly includes one or more carriers each having an offset flexible stopper portion spaced laterally outwardly away from an offset inner sealing portion that is adjacent an opening or other area requiring sealing between mating members adapted to be clamped together. An optional shim can be disposed adjacent to, and aligned with, the carrier. A resilient sealing material is applied to at least portions of the carrier and/or the shim, such as by screen printing, for example. The gasket assembly can be used advantageously in sealing applications such as those for cylinder heads and blocks, intake or exhaust manifolds, piping or other fluid conveying devices, housings, enclosures, or other situations where relative movement can occur between the members to be sealed to each other.

32 Claims, 11 Drawing Sheets

U.S. PATENT DOCUMENTS

| | | | |
|---|---|---|---|
| 6,250,644 B1 * | 6/2001 | Diez et al. .................. 277/595 |
| 6,322,084 B1 * | 11/2001 | Yamada et al. ............. 277/591 |
| 6,328,314 B1 * | 12/2001 | Jinno et al. ................. 277/593 |
| 6,336,639 B1 * | 1/2002 | Ishida et al. ................ 277/594 |
| 6,343,795 B1 * | 2/2002 | Zerfass et al. .............. 277/593 |
| 6,371,489 B1 | 4/2002 | Combet et al. |
| 6,378,876 B1 * | 4/2002 | Matsushita .................. 277/593 |
| 6,499,743 B2 | 12/2002 | Sadowski |
| 6,517,085 B2 * | 2/2003 | Udagawa et al. ........... 277/592 |
| 6,550,782 B2 | 4/2003 | Okazaki et al. |
| 6,565,097 B2 * | 5/2003 | Jinno ........................ 277/592 |
| 6,682,080 B2 * | 1/2004 | Miyaoh ...................... 277/592 |
| 6,722,662 B2 | 4/2004 | Heilig et al. |
| 6,769,696 B2 * | 8/2004 | Diez et al. .................. 277/593 |
| 6,791,659 B2 | 9/2004 | Choi |
| 7,000,924 B2 | 2/2006 | Hohe et al. |
| 2005/0046120 A1 * | 3/2005 | Novil et al. ................ 277/592 |
| 2006/0012131 A1 * | 1/2006 | Popielas et al. ............ 277/595 |

* cited by examiner

SEALING GASKET WITH FLEXIBLE STOPPER

CROSS-REFERENCE TO RELATED APPLICATIONS

This application is a Continuation-In-Part of U.S. Ser. No. 10/650,339, filed Aug. 28, 2003, now U.S. Publication No. 2005/0046120A1, published Mar. 3, 2005.

BACKGROUND AND SUMMARY OF THE INVENTION

The invention relates to a gasket for sealing between opposed mating surfaces of two or more members adapted to be forcibly mated together and to clamp the sealing gasket therebetween. More particularly, in a preferred form, the invention relates to such gaskets preferably having a single-layer carrier with unique embossments and a flexible stopper portion.

Conventional gaskets, such as those used to seal between a cylinder head and cylinder block of an internal combustion engine, include two or more carrier members, such as those composed of spring steel, having various embossments to achieve proper sealing as well as the recovery needed to accommodate dynamic lifting of the cylinder head or other relative movement between the head and block. Such gaskets frequently include a stopper, which is an additional thin strip of metal or other material having a high stiffness. The stopper is located adjacent or near the combustion opening of the gasket in order to distribute sufficient load around the combustion opening area to properly seal and to prevent over-compression of adjacent combustion sealing embossments. In such constructions, the stopper is typically welded onto the carrier or formed from a folded-over portion of the carrier around the circumference of the combustion opening. In these designs, the stopper acts as the primary seal, with one or more other embossments acting as a secondary seal.

Although performing relatively well, such prior art constructions often suffer from certain disadvantages caused by the high rigidity of the stopper, such as high bore distortion, cylinder liner recessing, and inadequate accommodation of dynamic head lifting. Such disadvantages are frequently aggravated by the location of such highly rigid stoppers at or closely adjacent the combustion opening of the gasket, the cylinder head and the cylinder block.

In order to improve upon such gasket designs and to address the disadvantages of gaskets of the type discussed above, as well as others, the present invention seeks to reduce bore distortion, to reduce liner recession, and to accommodate greater dynamic head lifting while more evenly distributing loads circumferentially about the combustion opening. In addition, since the preferred form of a gasket according to the invention has a lower-cost single layer carrier, it significantly reduces load loss resulting from the greater amount of creep caused by multiple layer constructions, as well as eliminating misalignment between multiple layers, tolerance stack up among multiple layers and associated load variations. A preferred form of the inventive gasket allows for carrier embossments that are preselected to have a desired relative flexibility, that provides greater capability to follow relative motion between the members being sealed, and that increases the gasket's ability to accommodate rough mating surfaces of the members over that of prior art multiple layer gaskets. It should be noted that gaskets constructed according to the present invention are applicable in a variety of cylinder head and cylinder block applications, such as those found in internal combustion engines or gas compressors, for example, as well as in intake or exhaust manifold sealing, fuel cell component sealing and numerous other automotive or non-automotive industrial applications.

The present invention provides an improved gasket for sealing between opposed mating surfaces of two or more members having openings therein and that are adapted to be forcibly mated together, continuously or at least intermittently, to clamp the gasket therebetween, thus sealing around such openings, which are laterally aligned for longitudinal communication with each other. A gasket according to the present invention includes a carrier having first and second laterally extending sides or surfaces defining a longitudinal thickness therebetween. The carrier includes a gasket opening (as well as other coolant, lubricant, fastener or other openings, as required in a given application), with the gasket opening being adapted to be laterally aligned in longitudinal communication with the openings in the mating surface of the members when the gasket is clamped between the mated members. The preferred carrier is resiliently flexible in the longitudinal direction, but is relatively rigid in comparison to other elements of the gasket. A resilient sealing material that is substantially more flexible than the carrier material is disposed on at least portions of the laterally extending sides of the carrier for sealingly engaging the mated surfaces of the members at least adjacent their openings when the gasket is clamped between the mated members.

The carrier preferably includes a longitudinally flexible inner sealing portion disposed laterally adjacent the gasket opening with the inner sealing portion being longitudinally offset relative to the remainder of said carrier portion (or relative to an intermediate carrier portion located laterally outward of the inner sealing portion). The inner sealing portion is preferably offset in a longitudinal direction toward a first of the mating surfaces of the members when the gasket is being clamped therebetween and can be formed by way of embossing the relatively rigid (but still resiliently flexible) carrier, as well as by way of other forming methods or devices known to those skilled in the art. The inner sealing portion preferably includes the above-mentioned resilient sealing material disposed on at least portions of its laterally-extending sides for sealing engagement with the mating surfaces of the members when the gasket is clamped therebetween. These carrier features can be formed as embossments, for example, either before or after application of the resilient sealing material.

The preferred carrier also includes a longitudinally flexible stopper portion spaced laterally outwardly, away from the gasket opening so that the inner sealing portion and the flexible stopper portion are on opposite lateral sides of the above-mentioned the intermediate portion, or at least so that the flexible stopper portion is laterally outward relative to the inner sealing portion (i.e., with or without the intermediate carrier portion). The preferred flexible stopper portion is longitudinally convex relative to the remainder of the carrier (or relative to the intermediate carrier portion) on a side of the flexible stopper oriented toward one of the mating surfaces and is longitudinally concave relative to the remainder of the carrier (or relative to the intermediate carrier portion) on an opposite side of the flexible stopper oriented toward another of the mating surfaces of the members. The stopper, which can have a generally trapezoidal shape, for example, thus flexibly and resiliently limits the amount of longitudinal compression of the inner sealing portion but is typically less flexible than the inner sealing portion. The inner sealing portion is thus maintained in sealing engagement with the mating surfaces of both of the members during any relative movement therebetween when the members are mated together.

In a preferred form of the invention, the inner sealing portion is longitudinally offset to an extent greater than the extent of the longitudinal convexity of the flexible stopper so as to assure deflection of the inner sealing portion prior to compression of the flexible stopper. In addition, the resilient sealing material is preferably disposed within, and can completely fill or at least partially fill the concave side of the flexible stopper member. In specific applications, however, it may be satisfactory to optionally omit the resilient sealing from completely filling the concave flexible stopper side altogether in any of the embodiments of the invention.

In any of the gasket embodiments according to the present invention, the inner sealing portion can optionally be longitudinally offset in various configurations, such as a generally "Z-shaped" half-embossment or a inclined or angled partially embossed or bent configuration, for example, as will become readily apparent to those skilled in the art from the drawings and from the following description and claims. Additionally, the inner sealing portion of the carrier, instead of being integrally formed by bending or by embossing as part of the carrier, can optionally be substantially separated from the remainder of the carrier member but interconnected and held in place by two or more connecting struts or by one or more "living hinges" formed of the resilient sealing material. Such living hinge or hinges can be between any pair of, or any combination of, the inner sealing portion, the intermediate carrier portion and/or the flexible stopper. Two or more flexible stoppers can also be optionally included in some or all of the embodiments of the invention, with such multiple flexible stoppers facing in opposite longitudinal directions, facing in the same longitudinal direction, or any combination of such orientations.

It should further be noted that gaskets according to the present invention can be advantageously used in a wide variety of applications, such as cylinder head and block sealing for internal combustion engines, gas compressors, or other devices having a sealed cylinder containing liquid or gaseous fluids, sealing intake, exhaust or other fluid conveying manifold applications, sealing between piping flanges, or sealingly isolating the interior from the exterior of housings or enclosures, for example. The present invention provides special advantages where relative movement can occur between the members being sealed, such as that due to thermal, mechanical or fluid conditions or environments presented by a particular applications. Those skilled in the art will undoubtedly recognize many other advantageous applications of gaskets according to the present invention.

In addition, it should be emphasized that in any of the embodiments discussed herein, more than one layer of a gasket according to the present invention can be used if desired or needed in various applications. Such applications include those where additional thickness is needed to match the thickness of a previous gasket or gasket assembly that is being replaced by a gasket assembly according to the present invention, or where particular (e.g., increased) spring rate, loading and/or deflection characteristics are desired or needed in conjunction with the flexible stopper characteristics and features discussed herein.

Additional objects, advantages, and features of the present invention will become apparent from the following description and the appended claims, taken in conjunction with the accompanying drawings.

DETAILED DESCRIPTION OF THE PREFERRED EMBODIMENTS

FIGS. 1 through 13 through 20 illustrate various embodiments of a gasket according to the present invention. For purposes of example, only, FIGS. 1 through 13 and 15 through 20 are primarily directed toward a cylinder head gasket for sealing between mating surfaces of a cylinder head and a cylinder block on an internal combustion engine, gas compressor, or other similarly configured device. It should be noted, however, as will become apparent to those skilled in the art from the following description and claims, the principles of the present invention illustrated in FIGS. 1 through 13 and 15 through 20 are equally applicable to other devices used in the automotive and non-automotive industrial areas, such as flanged piping components, enclosure or housing seals, piping system manifold seals, or other devices where proper sealing and flexibility is desired between opposed mating surfaces of two or more members, as is illustrated conceptually in FIG. 14.

Referring initially to FIGS. 1 through 4 and 6, one preferred embodiment of the invention is represented by an exemplary gasket 10 for sealing between a mating member 12 and a mating member 14, which are adapted to be matingly clamped together, with the gasket 10 therebetween, such as by bolts or other conventional clamping devices. The mating members 12 and 14 have respective laterally-extending mating surfaces 13 and 15 surrounding respective openings 16 and 18, which are configured for conducting fluids between the members 12 and 14 generally in a longitudinal direction 22.

Figure 1:
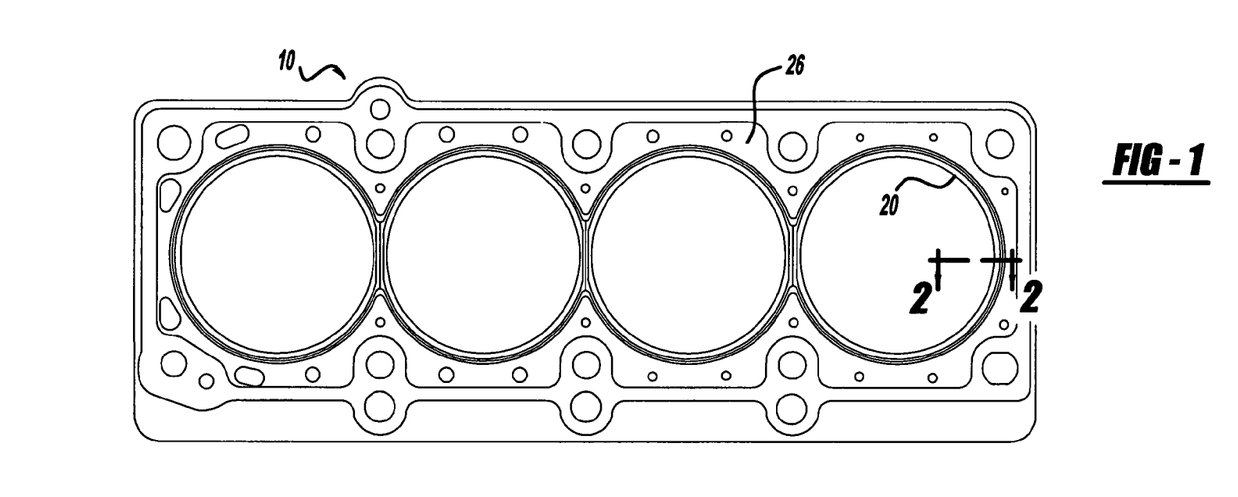
FIG. 1 depicts one laterally-extending side of one exemplary preferred gasket according to the present invention, with the gasket being adapted for sealing between a cylinder head and a cylinder block.

The gasket 10 of FIG. 1 includes a relatively rigid, but still flexible, carrier 24, laterally-extending gasket sides 26 and 28, a complete coating (or at least a localized coating) of a much more flexible, resilient sealing material 32, and a gasket opening 20 adapted to be laterally aligned with the openings 16 and 18 of the members 12 and 14 for longitudinal communication therebetween. The gasket 10 further includes a longitudinally-offset inner sealing portion 36, an intermediate portion 38, and a longitudinally offset flexible stopper 40.

Figure 2:
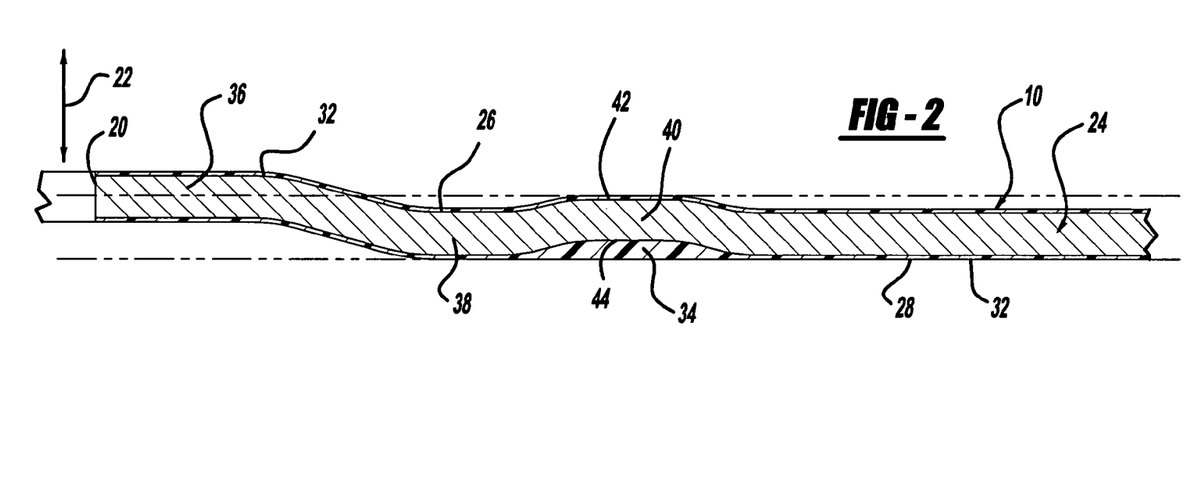
FIG. 2 is a partial cross-sectional view, taken along line 2—2 of FIG. 1.

Preferably, exemplary the flexible stopper 40 (which can be characterized as a "full embossment") is longitudinally offset to a lesser extent than the inner sealing portion 36 (which can similarly be characterized as a "half embossment"). It is important to emphasize that, unlike the more rigid stoppers of prior art gaskets, the flexible stopper 40 is spaced away from the gasket opening 20 (as well as from the mating member openings 16 and 18), with the primary sealing component of the gasket (i.e., the inner sealing portion 36) and the intermediate portion 38 being between the flexible stopper 40 and the gasket opening 20. The flexible stopper 40 preferably has a convex side 42 and a concave side 44, either of which can be oriented toward either of the members 12 or 14. The concave side 44 can optionally be merely coated with the resilient sealing material 32 or partially or completely filled with the resilient sealing material 32. Typically, although not necessarily in a given application, the inner sealing portion 36 is more flexible than the flexible stopper 40.

Examples of materials for the carrier 40 can include semi-rigid synthetic or natural materials, metals or non-metals, with one example being composed of 301 stainless spring steel, full-hard, 0.3 mm thick (approximately 0.2 mm to 0.5 mm, or even wider ranges of thicknesses may be used in given applications). Lower hardnesses of steel or other metals can of course also be used if a reduction in spring force is desired in a particular application. However, such softer materials may, over time, exhibit a decrease in recovery performance during unloading conditions, such as those resulting from relative movement between the mating members Other metals or metal alloys may also have application in the present invention, such as hardened carbon steel, inconel, titanium, or still others known to those skilled in the art.

Examples of materials for the resilient sealing material 32 in the illustrated example can include those that are applied to the carrier material prior to forming the carrier itself, those coated onto the carrier after it is formed, or even localized coating only in desired areas, such as those adjacent the gasket opening 20 or other areas adjacent fluid openings (e.g., for lubricant, for cooling, etc.), bolt holes, or the like. Such resilient sealing material 32 is preferably on at least both sides of any or all of the inner sealing portion 36, the intermediate portion 24, or the flexible stopper 40. If desired to be applied only in localized areas of the gasket 20, resilient sealing material 32 can be applied in a variety of different ways, such as by screen printing, for example. In this regard, it should also be noted that the concave side 44 of the flexible stopper 40 can be merely coated (as in the concave side 144 on the stopper 140 shown in FIG. 9) or partially or completely filled with the resilient sealing material 32, either locally or as part of a larger or even an overall coating of the carrier 24. In one form of the invention, the preferred resilient sealing material is FKM, having a thickness of approximately 0.0002 inch to approximately 0.003 inch, although a much wider range of thicknesses can be used, as required or desirable in a particular application. Other resilient and conformable materials may also be suitable in any of a wide variety of applications, such as nitrile or silicone, for example.

Figure 3:
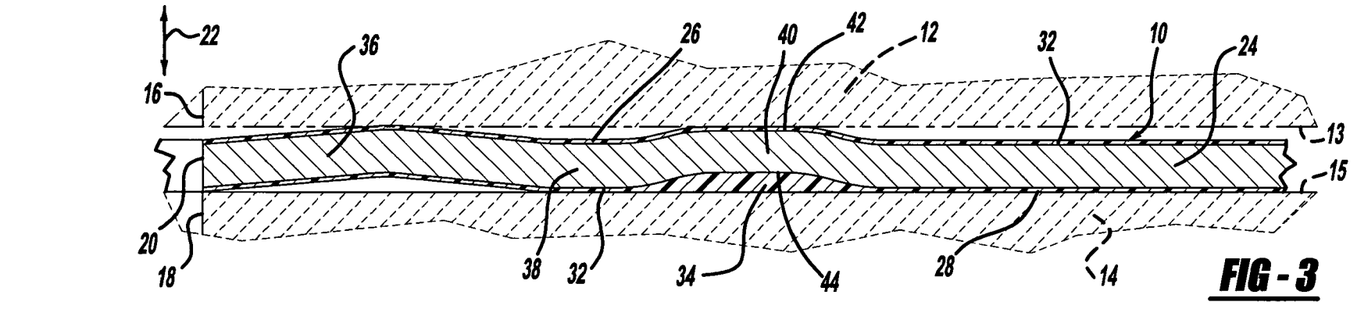
FIG. 3 is a partial cross-sectional view, illustrating the exemplary gasket of FIG. 1 in a partially compressed condition.

In FIG. 3, the gasket 10 is shown partially compressed between the members 12 and 14. In this condition, as well as in other more fully compressed conditions, the inner sealing portion 36 typically deflects first and provides the primary sealing about the openings 16, 18 and 20. The flexible stopper 40, being typically less flexible than the inner sealing portion 36, limits the amount of compression or deflection of the inner sealing portion 36, but it performs this function flexibly, unlike the much more rigid stoppers of prior art gaskets. This allows the gasket to provide more effective, repeatable and reliable sealing between the members 12 and 14, especially during lower load conditions, such as those resulting from relative movement between the members 12 and 14 due to compression, combustion, exhaust, or other varying pressures.

Figure 4:
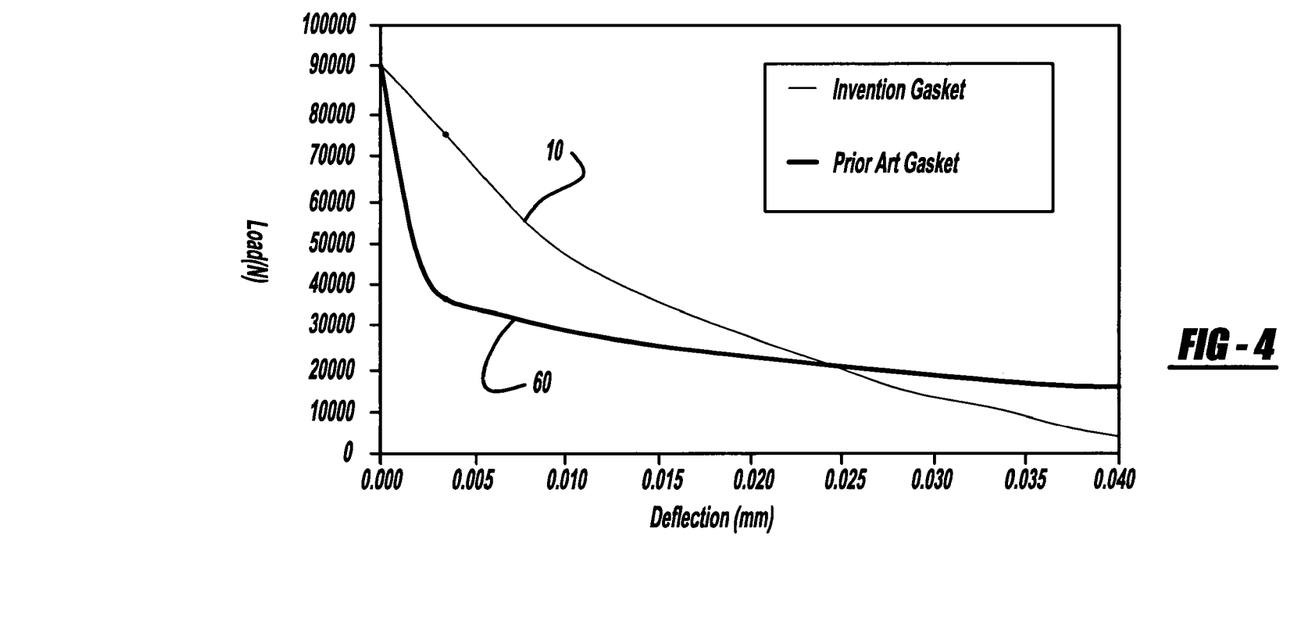
FIG. 4 illustrates unloading curves for the exemplary gasket of FIG. 1 and for a typical multiple layer prior art gasket, with load plotted against relative deflection of the mating members, in order to illustrate the invention's improved load retention characteristics.
Figure 5:
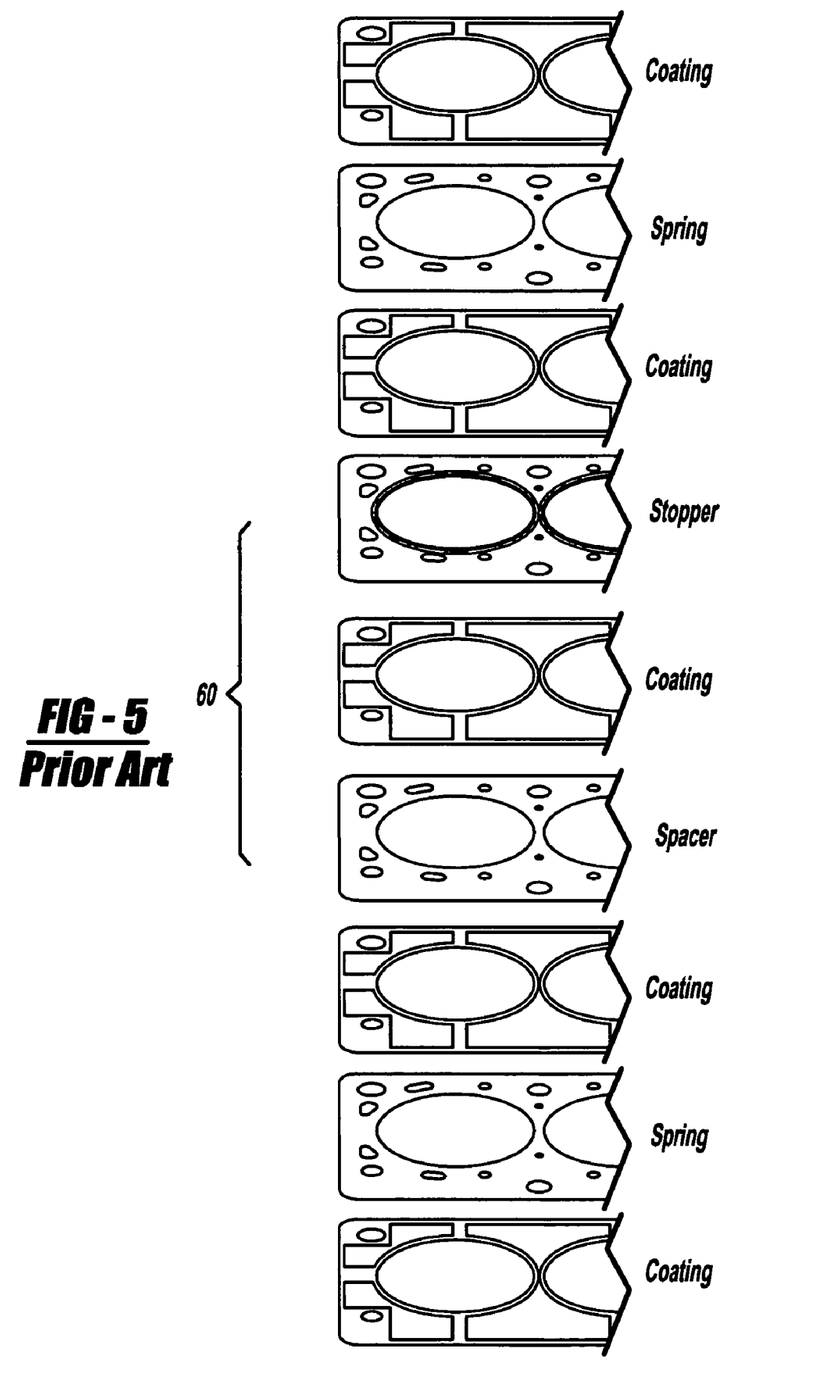
FIG. 5 is a partially exploded view, illustrating a typical multiple layer prior art gasket.
Figure 6:
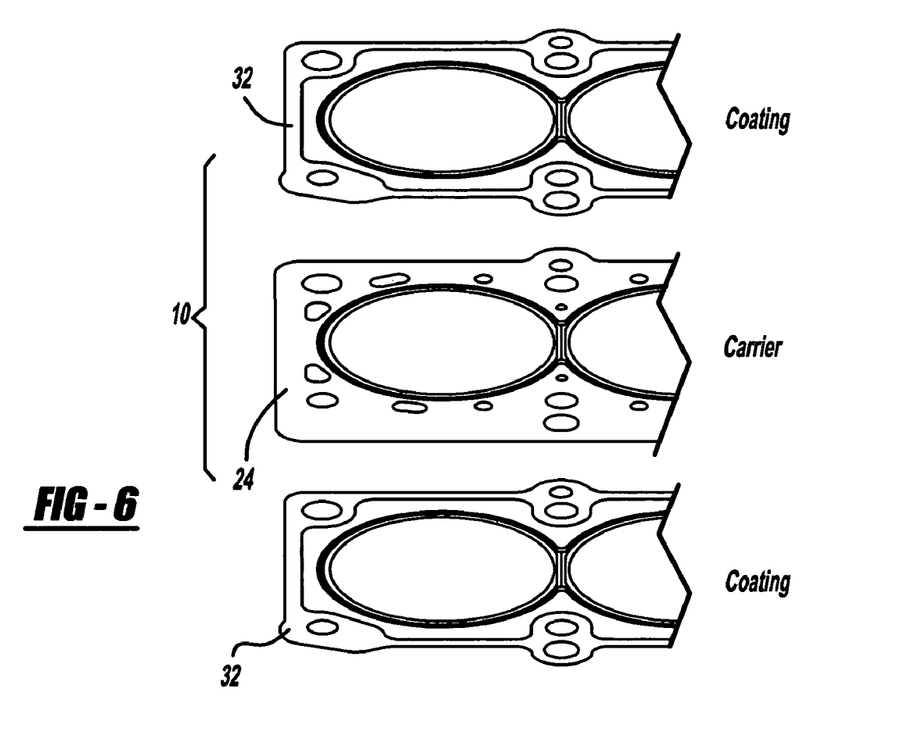
FIG. 6 is a partially exploded view, similar to FIG. 5, but illustrating the preferred, flexible but relatively rigid, single carrier member of FIG. 1 sandwiched between two layers of the more highly flexible resilient sealing material.
Figure 7A:
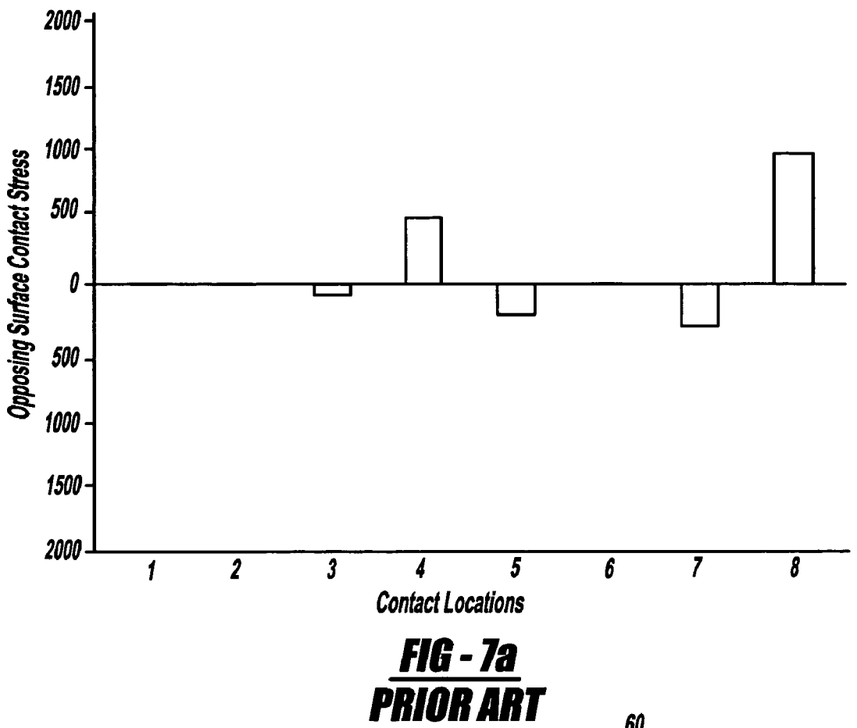
FIGS. 7a and 7b illustrate an example of contact point stress values in opposite directions on opposite mating members during unloading between the mating members for a typical multiple layer prior art gasket.
Figure 7B:
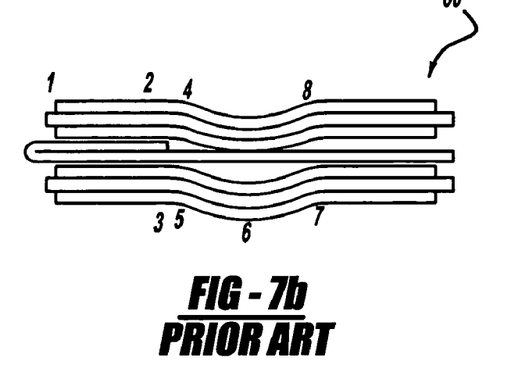
Figure 8A:
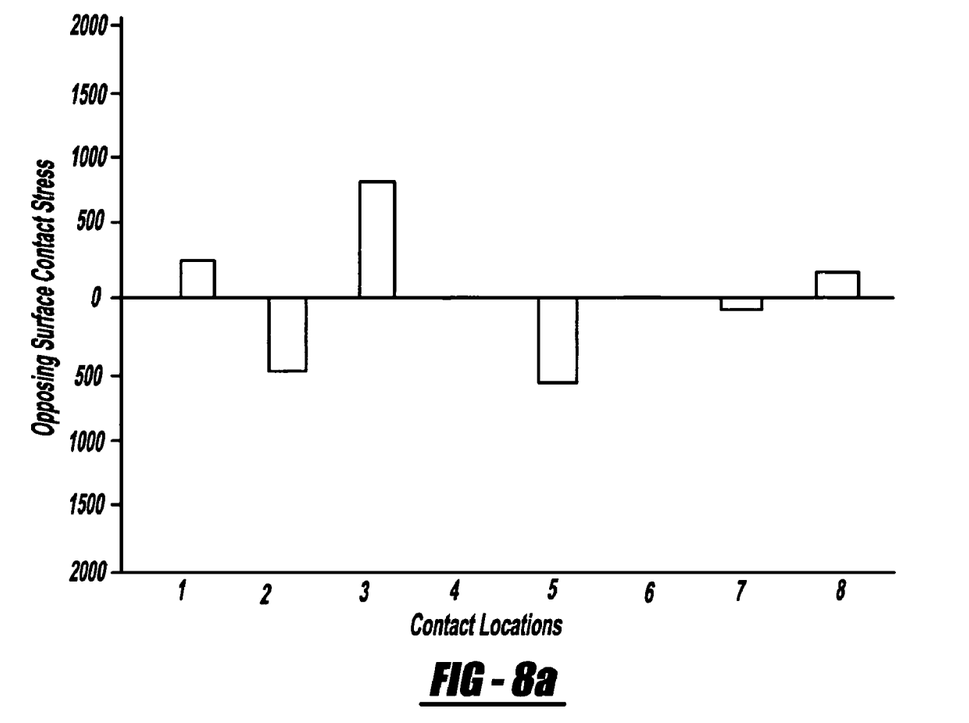
FIGS. 8a and 8b are similar to FIGS. 7a and 7b, respectively, but illustrating such contact point stress values in opposite directions on opposite mating members during unloading for an exemplary gasket according to the present invention having a single layer carrier.
Figure 8B:
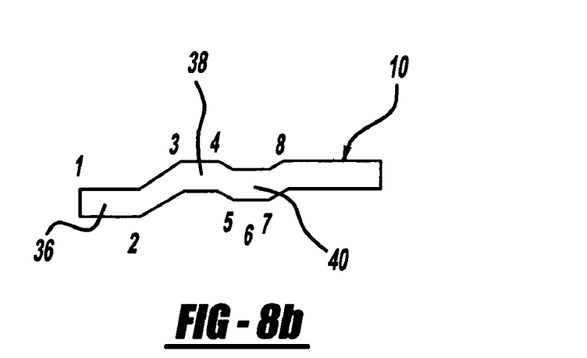
Figure 9:
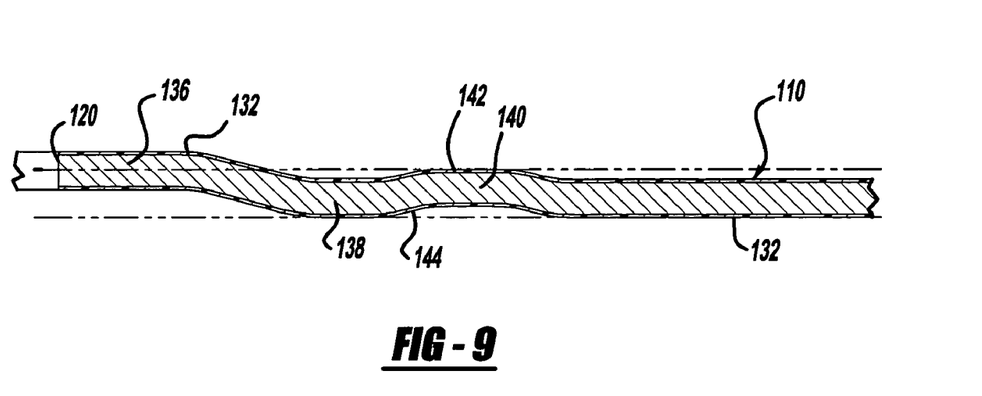
FIG. 9 is a partial cross-sectional view of an alternate gasket according to the present invention, which is similar to that of FIGS. 1 and 2, except that the flexible stopper portion is coated but not filled with resilient material on its concave side.

This advantage is further illustrated in FIG. 4, wherein the invention is capable of higher (and thus more leak-proof) sealing loadings than is a typical multiple layer gasket of the prior art, such as that illustrated in FIG. 5, for example, throughout design operating ranges. This advantageous comparison is also evident from FIGS. 7a and 7b (prior art)

and FIGS. 8a and 8b, wherein the contact stresses on the opposed mating surfaces of the mating members (e.g., surfaces 13 and 15 on members 12 and 14, for example) are graphically represented at various location 1 through 8 on the mating surfaces.

Again referring to FIG. 5, it is also important to note that such multiple layer prior art gaskets, such as the gasket 60, require sealing material on both sides of each layer, with the multiple and separately coated layers significantly adding to their cost, as well as presenting the other disadvantages discussed above.

FIGS. 10 through 14 illustrate other alternate constructions or embodiments, with the reference numerals in FIGS. 10 through 14 indicating similar or corresponding elements to those of FIGS. 1 through 9, but with two-hundred through six hundred prefixes, respectively.

Figures 10, 11:
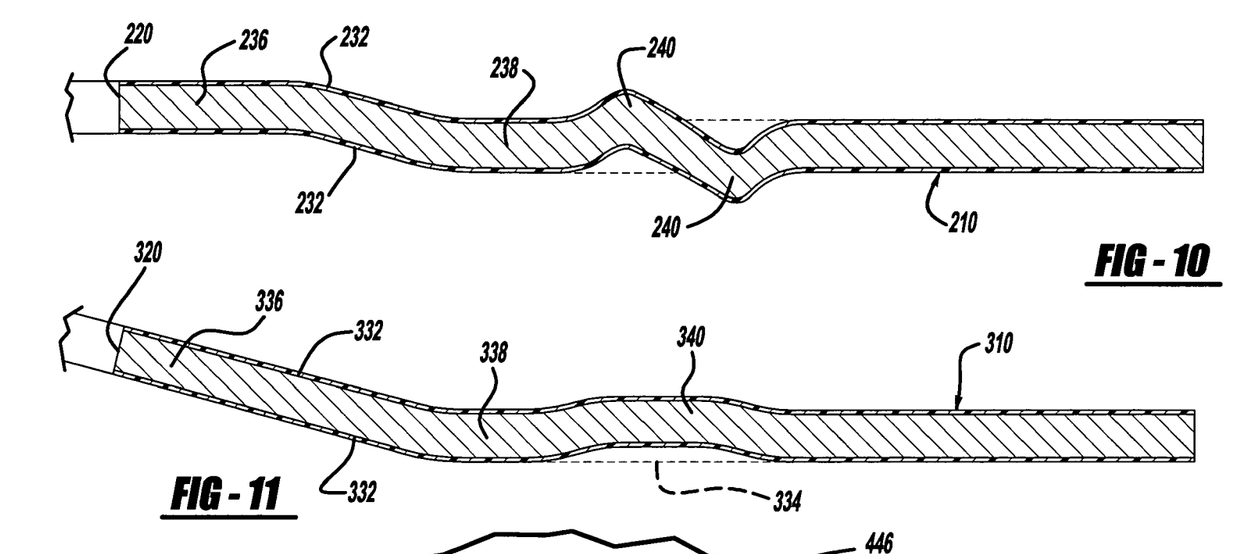
FIG. 10 is a partial cross-sectional view, similar to that of FIGS. 2 and 9, but illustrating yet another alternate embodiment of a gasket according to the present invention, wherein the flexible stopper portion has a generally serpentine, "S-shaped" cross-sectional shape, essentially forming multiple flexible stoppers, with the concave portions of the flexible stopper portion alternatively being merely coated with the resilient material or at least partially filled with the resilient material.
FIG. 11 is a partial cross-sectional view similar to that of FIGS. 2, 9 and 10, but illustrating still another alternate embodiment of a gasket according to the present invention, with the inner seal portion extending in a laterally and longitudinally inclined or angled direction, and with the flexible stopper portion being alternately merely coated with the resilient material or at least partially filled with the resilient material.
Figure 12A:
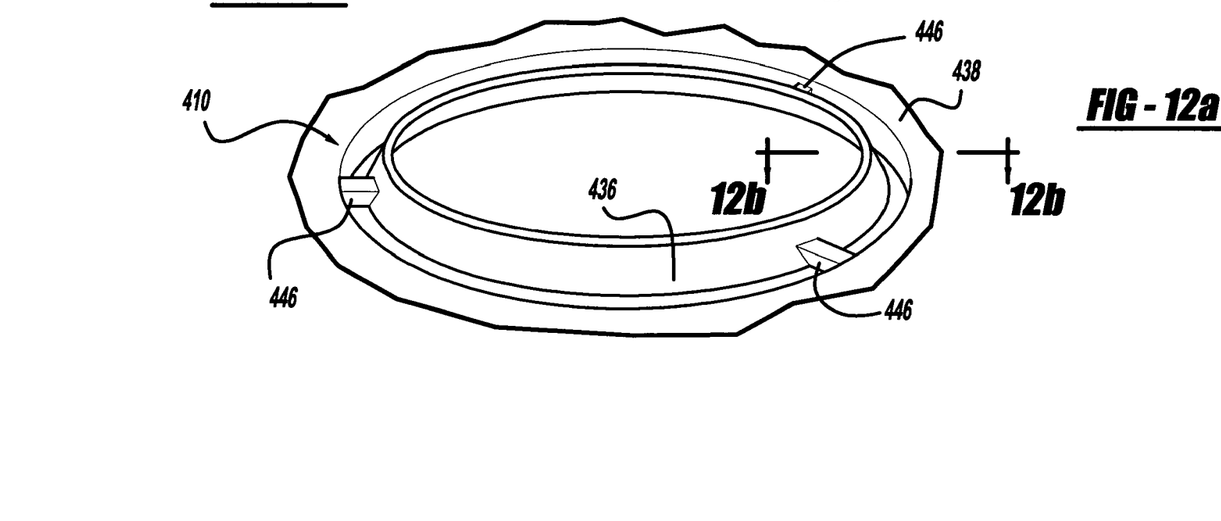
FIGS. 12a and 12b illustrate a partial perspective view and a partial cross-sectional view, respectively, of another alternate embodiment of the present invention, wherein the inner sealing portion of the carrier is substantially separated from the remainder of the carrier member but interconnected and held in place by two or more connecting struts.
Figures 12B, 13A, 13B:
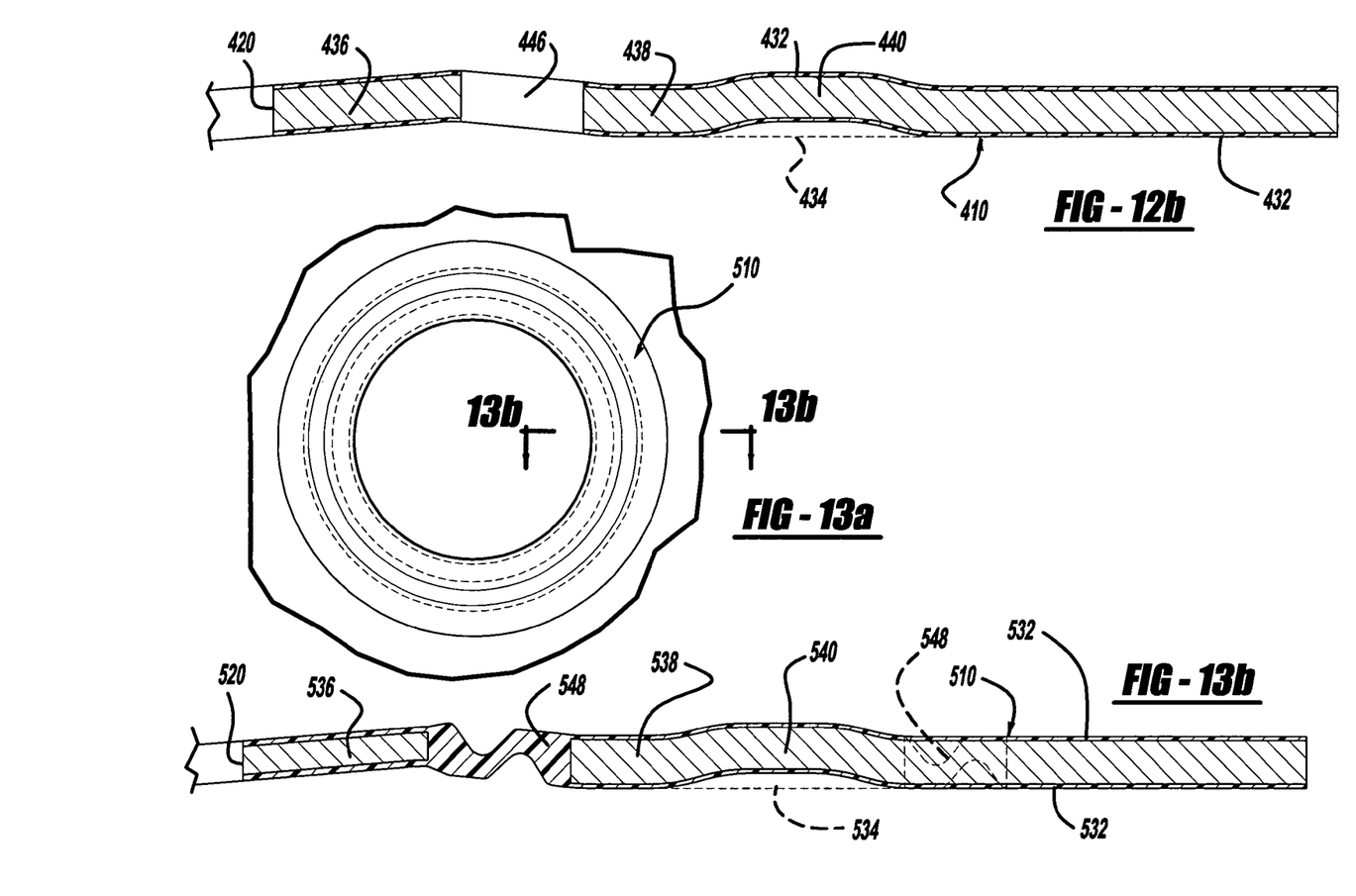
FIGS. 13a and 13b are similar to those of FIGS. 12a and 12b, respectively, but illustrating yet another alternate embodiment of the present invention, wherein the inner sealing portion of the carrier member is separate from the remainder of the carrier member, but with the inner sealing portion and the intermediate carrier portion being interconnected by one or more "living hinge" sections of the resilient material.

FIG. 10 illustrates a gasket 210, a generally serpentine flexible stopper 240, effectively forming a number of flexible stopper portions 240. In FIG. 11, the inner sealing portion 336 is longitudinally offset in an inclined or angled direction. FIGS. 12a and 12b illustrate a separated inner sealing portion 436 interconnected with the remainder of the gasket 410 and held in its proper position by one or more struts 446. Similarly, in FIGS. 13a and 13b, a separated inner sealing portion 536 is interconnected with the remainder of the gasket 510 and held in its proper position by one or more "living hinge" portions 536 of the resilient sealing material 532. It should be noted that this construction also allows for different thicknesses of the inner sealing portion 536 and the remainder of the gasket 510 (with either of them being thicker or thinner than the other) in order to obtain particular deformation and load retention characteristics in a given application.

Figure 14:
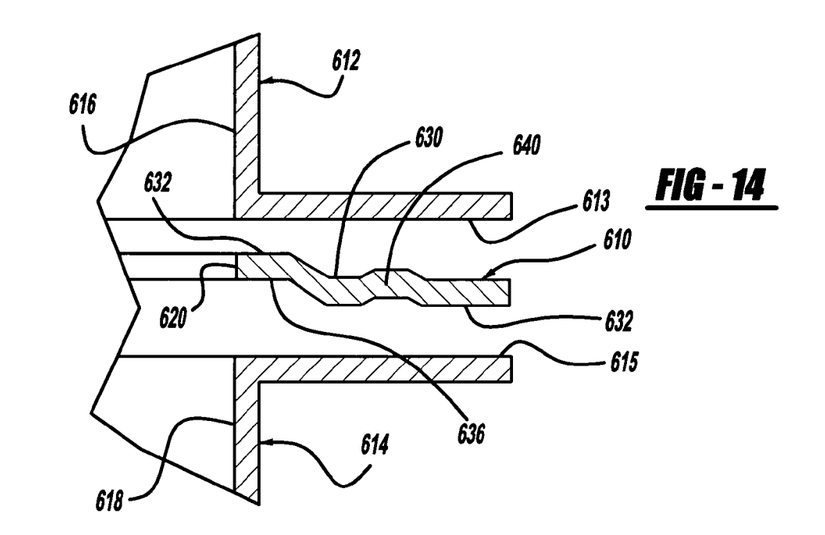
FIG. 14 is a partial schematic cross-section, conceptually illustrating other examples of other applications of the present invention.

FIG. 14 schematically illustrates, in conceptual form, the use of a gasket 610 according to the present invention in a wide variety of applications, with the gasket 610 having any or any combination of the features, shapes or characteristics discussed above in connection with FIGS. 1 through 13. The members 612 can be flanges or other portions of any of numerous devices or structures, such as intake, exhaust or other manifolds, piping or other fluid-conveying devices, gas compression or other high pressure constructions, sealed housings or enclosures, or other sealing applications known to those skilled in the art. As mentioned above, the invention is especially advantageous where relative movement can occur between the members being sealed, such as that caused by thermal, mechanical or fluid conditions or environments presented by a particular applications.

Figure 15:
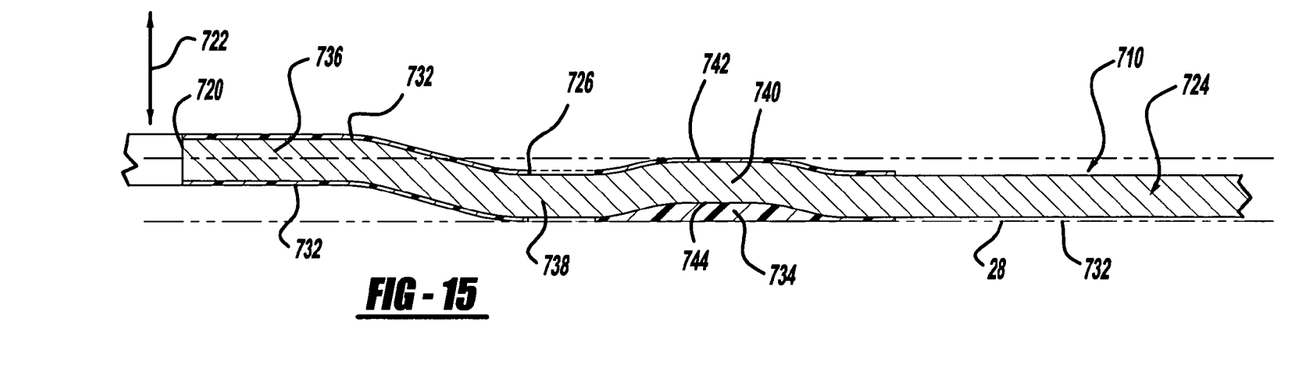
FIG. 15 is a partial cross-section similar to that of FIG. 2, but illustrating the resilient sealing material covering only portions of the carrier member as mentioned above.
Figure 16:
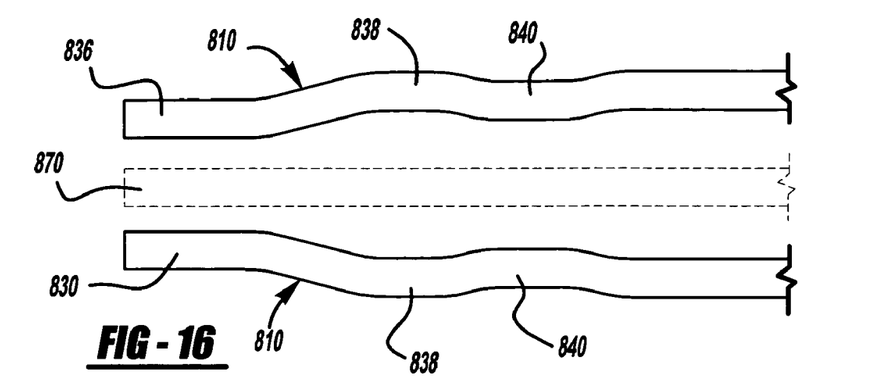
FIGS. 16 through 20 diagrammatically illustrate still further exemplary embodiments, wherein one or more of the gasket constructions discussed above (with or without an accompanying shim member) may be desired in given applications.
Figure 17:
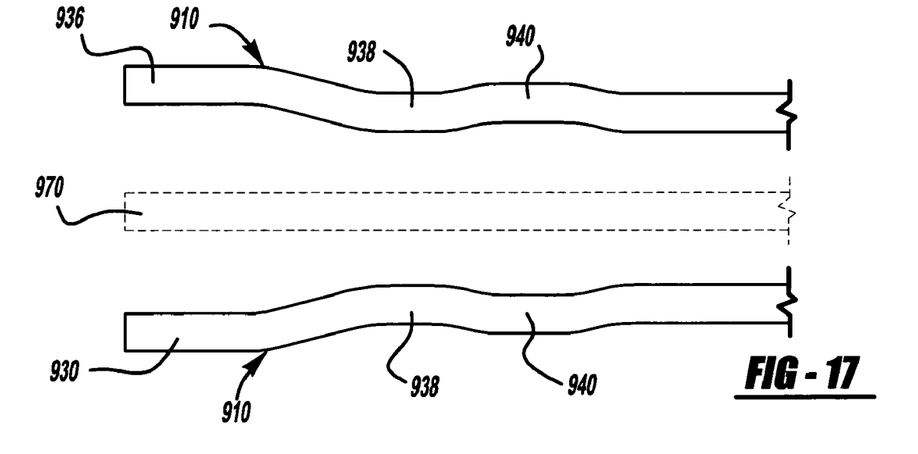
Figure 18:
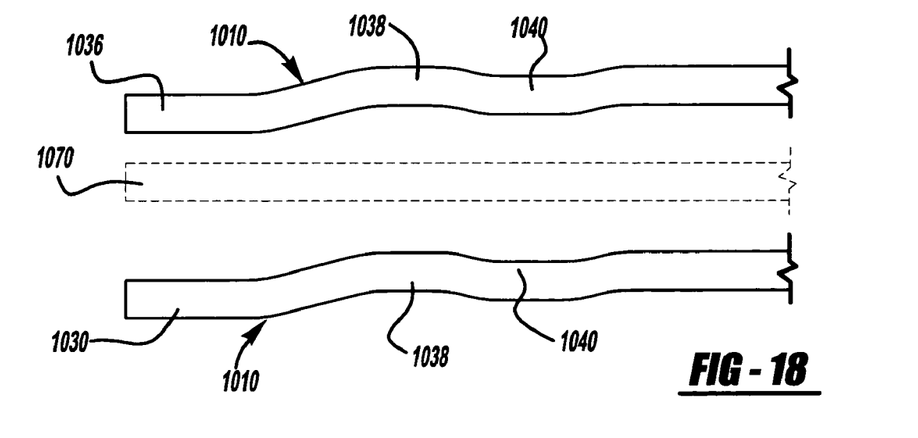
Figure 19:
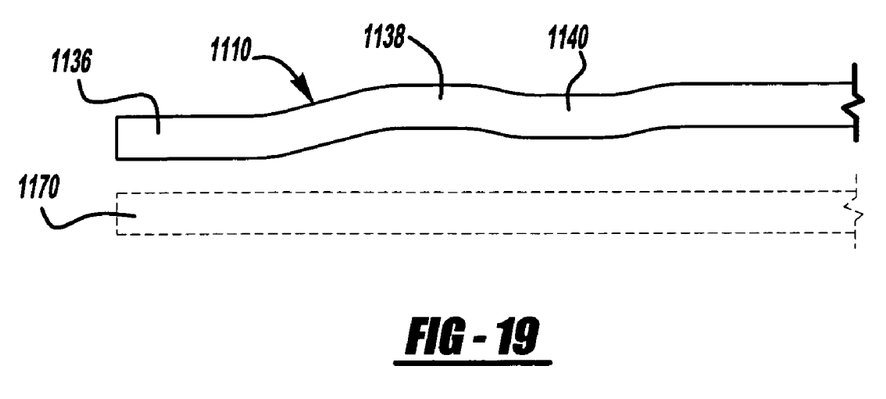
Figure 20:
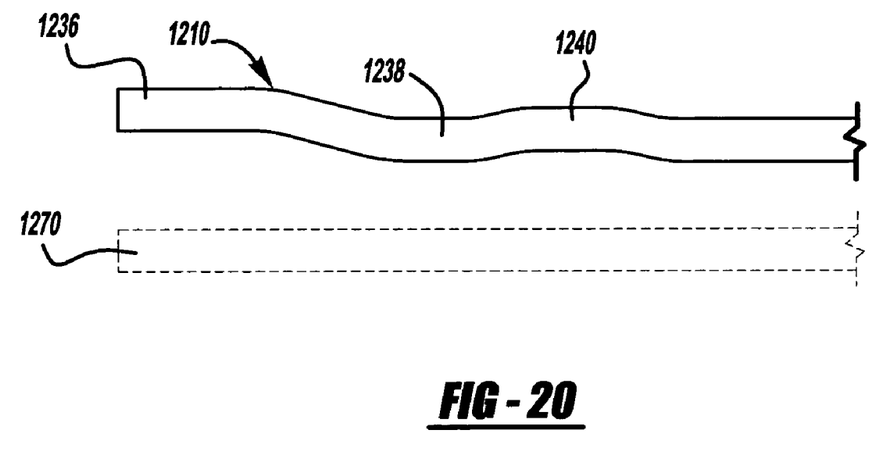

FIG. 15 (taken along with the other figures) merely illustrates that the resilient sealing material 732 can optionally be included on all or selected portions of the carrier member 724 of the gasket 710.

In addition, exemplary FIGS. 16 through 20 illustrate that any of the embodiments described herein can be used as part of a gasket assembly having one, two or even more of the gaskets 10 through 710 discussed above for sealing between at least a pair of mating surfaces. Such assemblies of the gaskets 810 through 1010, in FIGS. 16 through 18, respectively, can be provided where additional thickness is needed. Such assemblies of gaskets 810 through 1010, and even the single gasket applications 1110 and 1210 of FIGS. 19 and 20, can also be used to obtain desired spring rate, loading and/or deflection characteristics (e.g., increases in some or all of these characteristics) while still gaining the advantageous flexible stopper characteristics discussed above. In this regard, it should also be pointed out that either or both sides of the gasket members 810 through 1210, or portions thereof, can optionally be coated with the resilient sealing materials mentioned above.

The shim members 870 through 1270 can optionally be included in any of the embodiments shown herein. The shim members can act as spacers and/or provide a surface against which the loading on the gaskets can be transferred so as to obtain the intended spring rate, loading and/or deflection characteristics. These intended effects might not be obtained if multiple gaskets were not separated by shim members and allowed to completely or partially "nest" within portions of each other, or otherwise incorrectly contact each other, such as could result in an application like that shown in FIG. 18, for example.

As will now be apparent to those skilled in the art, the shims 870 through 1270 can be constructed either of relatively resilient sheet materials or of relatively rigid sheet materials and can be of widely-varying thicknesses in order to obtain the above-mentioned desired gasket assembly characteristics. Although the embodiments of FIGS. 16 and 17 can advantageously include the shim members 870 and 970, respectively, it is believed to be even more likely that the embodiments of FIGS. 18 through 20 would require the inclusion of the respective shim members 1070 through 1270. Like the gaskets 810 through 1210, either or both sides (or portions thereof) of the shim members 870 through 1270 can also optionally be coated with the above-described resilient sealing material if needed or desired in particular applications.

The foregoing discussion discloses and describes merely exemplary embodiments of the present invention for purposes of illustration only. One skilled in the art will readily recognize from such discussion, and from the accompanying drawings and claims, that various changes, modifications and variations can be made therein without departing from the spirit and scope of the invention as defined in the following claims.

What is claimed is:

1. An improved gasket assembly for sealing between longitudinally opposed mating surfaces of at least a pair of members adapted to be forcibly mated together to clamp said gasket therebetween, the mating surfaces having openings therein laterally aligned in longitudinal communication with each other when the members are mated together, said gasket comprising:

at least two relatively rigid carriers each having first and second laterally-extending sides defining a longitudinal thickness therebetween, said carriers each having at least one gasket opening therethrough adapted to be laterally aligned in longitudinal communication with the openings in the mating surfaces of the members when said gasket assembly is clamped between the mated members, said first and second carriers being at least partially separated from one another at least in an unclamped state;

a longitudinally flexible inner sealing portion of each of said carriers disposed laterally adjacent and substantially defining the periphery of said gasket opening, said inner sealing portion being longitudinally offset relative to the remainder of said carrier, said inner sealing portion being offset in a longitudinal direction toward a first of the members when said gasket assembly is clamped between the mated members; and a longitudinally flexible outer stopper portion of each of said carriers spaced laterally away from said gasket opening and disposed laterally outward relative to said inner sealing portion, said flexible outer stopper portion and said inner sealing portion being in close lateral proximity with each other and in close lateral proximity with the same said gasket opening, said flexible stopper portion being longitudinally convex relative to the remainder of said carrier on a side of said flexible stopper oriented in a direction toward said first of the members and being longitudinally concave relative to the remainder of said carrier on an opposite side of said flexible stopper oriented in a direction toward a second of the members, said flexible stopper acting in conjunction with said inner sealing portion and with respect to the same said gasket opening to flexibly limit the amount of longitudinal compression of said inner sealing portion and being less flexible than said inner sealing portion, one of said inner sealing portions being thereby maintained in said sealing engagement with the mating surface of one of the members during relative movement between the members when the members are mated together.

2. The gasket assembly of claim 1, further including a resilient sealing material substantially more flexible than said carriers and being disposed on at least portions of at least one of said laterally-extending sides of at least one of said carriers oriented in said directions toward the mating surfaces of the members when said gasket assembly is clamped between the mated members.

3. The gasket assembly of claim 2, wherein said inner sealing portions have said resilient sealing material disposed on at least portions of their laterally-extending sides oriented in said directions toward said mating surfaces of the members when said gasket assembly is clamped between the mated members.

4. The gasket assembly of claim 2, wherein at least one of said flexible stopper members has said resilient sealing material disposed within and at least partially filling its concave side oriented in said direction toward said second of the members when said gasket assembly is clamped between the mated members.

5. The gasket assembly of claim 2, wherein at least one of said flexible stoppers has said resilient sealing material disposed on at least portions of its laterally-extending sides when said gasket assembly is clamped between the mated members.

6. The gasket assembly of claim 5, wherein each of said flexible stopper members has an additional amount of said resilient sealing material disposed within and at least partially filling its concave side oriented in a direction toward said second of the members.

7. The gasket assembly of claim 2, wherein said resilient sealing material is a rubber-containing material.

8. The gasket assembly of claim 2, wherein said resilient sealing material is an elastomer-containing material.

9. The gasket assembly of claim 2, wherein said resilient sealing material covers substantially all of at least one of said laterally-extending sides of at least one of said carriers.

10. The gasket assembly of claim 2, wherein said resilient sealing material is adjacent at least portions of at least one of said carriers.

11. The gasket assembly of claim 2, wherein said resilient sealing material is screen-printed onto at least portions of at least one of said carriers.

12. The gasket assembly of claim 2, wherein at least portions of at least one of said carriers are separated but interconnected by a portion of said resilient sealing material.

13. The gasket assembly of claim 1, wherein said inner sealing portions are longitudinally offset to an extent greater than the extent of longitudinal convexity of the respective flexible stopper portions.

14. The gasket assembly of claim 1, wherein each of said inner sealing portions has a lateral dimension greater than the lateral dimension of the respective flexible stoppers.

15. The gasket assembly of claim 1, wherein each of said relatively rigid carriers is a single layer carrier.

16. The gasket assembly of claim 1, wherein at least one of said carriers is formed of a metal-containing material.

17. The gasket assembly of claim 1, wherein at least one of said carriers is formed of a steel-containing material.

18. The gasket assembly of claim 1, wherein at least one of said carriers is formed of a synthetic-containing material.

19. The gasket assembly of claim 1, wherein said gasket assembly is adapted to be clamped between a cylinder head and a cylinder block of an internal combustion engine.

20. The gasket assembly of claim 1, wherein said gasket assembly is adapted to be clamped between a cylinder head and a cylinder block of a gas compressor.

21. The gasket assembly of claim 1, wherein said gasket assembly is adapted to be clamped between mated flanges of a gaseous fluid-conveying device.

22. The gasket assembly of claim 1, wherein said gasket assembly is adapted to be clamped between mated flanges of a liquid fluid-conveying device.

23. The gasket assembly of claim 1, wherein said gasket assembly is adapted to be clamped between mated pipe flanges.

24. The gasket assembly of claim 1, wherein said gasket assembly is adapted to be clamped between mated manifold flanges.

25. The gasket assembly of claim 1, wherein said gasket assembly is adapted to be clamped between mating surfaces of members defining an interior of an enclosure for sealingly isolating said enclosure interior from an exterior of said enclosure.

26. The gasket assembly of claim 1, wherein said gasket assembly is adapted to be clamped between mating surfaces of members that are releasably mated together.

27. The gasket assembly of claim 1, wherein said gasket assembly is adapted to be clamped between mating surfaces of members that are intermittently mated together.

28. The gasket assembly of claim 1, wherein the mating members are components of a fuel cell.

29. The gasket assembly of claim 1, further including a shim disposed between said carriers.

30. The gasket assembly of claim 29, further including a resilient sealing material substantially more flexible than said carriers and being disposed on at least portions of at least one side of said shim.

31. An improved gasket assembly for sealing between longitudinally opposed mating surfaces of at least a pair of members adapted to be forcibly mated together to clamp said gasket therebetween, the mating surfaces having openings therein laterally aligned in longitudinal communication with each other when the members are mated together, said gasket comprising:

at least one relatively rigid carrier having first and second laterally-extending sides defining a longitudinal thickness therebetween, said carrier having at least one gasket opening therethrough adapted to be laterally aligned in longitudinal communication with the openings in the mating surfaces of the members when said gasket assembly is clamped between the mated members;

a generally planar shim disposed adjacent at least one of said laterally-extending sides of said carrier between said carrier and at least one of the members, said shim having a gasket opening therethrough adapted to be laterally aligned in longitudinal communication with said gasket opening through said carrier;

a longitudinally flexible inner sealing portion of said carrier disposed laterally adjacent and substantially defining the periphery of said gasket opening, said inner sealing portion being longitudinally offset relative to the remainder of said carrier, said inner sealing portion being offset in a longitudinal direction toward a first of the members when said gasket assembly is clamped between the mated members;

a longitudinally flexible outer stopper portion of said carrier spaced laterally away from said gasket opening and disposed laterally outward relative to said inner sealing portion said flexible outer stopper portion and said inner sealing portion being in close lateral proximity with each other and in close lateral proximity with the same said gasket opening, said flexible stopper portion being longitudinally convex relative to the remainder of said carrier on a side of said flexible stopper oriented in a direction toward said first of the members and being longitudinally concave relative to the remainder of said carrier on an opposite side of said flexible stopper oriented in a direction toward a second of the members, said flexible stopper portion being generally trapezoidal in cross-section and being longitudinally offset relative to the remainder of said carrier, said inner sealing portion being longitudinally offset to a greater extent than said flexible stopper portion, said flexible stopper portion acting in conjunction with said inner sealing portion and with respect to the same said gasket opening to flexibly limit the amount of longitudinal compression of said inner sealing portion and being less flexible than said inner sealing portion, said inner sealing portion being thereby maintained in said sealing engagement during relative movement between the members when the members are mated together;

further including a resilient sealing material substantially more flexible than said carrier and being disposed on at least portions of at least one side of said shim; and wherein at least portions said carrier is separated but interconnected by a portion of said resilient sealing material.

32. An improved gasket assembly for sealing between longitudinally opposed mating surfaces of at least a pair of members adapted to be forcibly mated together to clamp said gasket therebetween, the mating surfaces having openings therein laterally aligned in longitudinal communication with each other when the members are mated together, said gasket comprising:

at least two relative rigid carriers each having first and second laterally-extending sides defining a longitudinal thickness therebetween, said carriers each having at least one gasket opening therethrough adapted to be laterally aligned in longitudinal communication with the openings in the mating surfaces of the members when said gasket assembly is clamped between the mated members, said first and second carriers being at least partially separated from one another at least in an unclamped state;

a longitudinally flexible inner sealing portion of each of said carriers disposed laterally adjacent and substantially defining the periphery of said gasket opening, said inner sealing portion being longitudinally offset relative to the remainder of said carrier, each said inner sealing portion being offset in a longitudinal direction toward one another when said gasket assembly is clamped between the mated members; and a longitudinally flexible outer stopper portion of each of said carriers spaced laterally away from said gasket opening and disposed laterally outward relative to said inner sealing portion, said flexible outer stopper portion and said inner sealing portion being in close lateral proximity with each other and in close lateral proximity with the same said gasket opening, each said flexible stopper portion being longitudinally convex relative to the remainder of said carrier on a side of said flexible stopper oriented in a direction away from an adjacent one of the members and being longitudinally concave relative to the remainder of said carrier on an opposite side of said flexible stopper oriented in a direction away from the other of the members, said flexible stopper is generally trapezoidal in cross-section and is longitudinally offset relative to the remainder of said carrier to a lesser extent than said inner sealing portion, said flexible stopper acting in conjunction with said inner sealing portion and with respect to the same said gasket opening to flexibly limit the amount of longitudinal compression of said inner sealing portion and being less flexible than said inner sealing portion, a portion of said carriers between said inner sealing portion and said flexible outer stopper portion being thereby maintained in sealing engagement with the mating surfaces of each of the members during relative movement between the members when the members are mated together.

\* \* \* \* \*